(12) United States Patent
Ross et al.

(10) Patent No.: US 11,126,251 B2
(45) Date of Patent: Sep. 21, 2021

(54) POWER MANAGEMENT IN MEMORY

(71) Applicant: Micron Technology, Inc., Boise, ID (US)

(72) Inventors: Frank F. Ross, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 267 days.

(21) Appl. No.: 16/290,181

(22) Filed: Mar. 1, 2019

(65) Prior Publication Data

US 2020/0278736 A1 Sep. 3, 2020

(51) Int. Cl.
| | |
|---|---|
| *G06F 1/32* | (2019.01) |
| *G06F 1/3234* | (2019.01) |
| *G11C 5/14* | (2006.01) |
| *G06F 3/06* | (2006.01) |

(52) U.S. Cl.
CPC .......... *G06F 1/3275* (2013.01); *G06F 3/0604* (2013.01); *G06F 3/0647* (2013.01); *G06F 3/0673* (2013.01); *G11C 5/147* (2013.01)

(58) Field of Classification Search
CPC ..... G11C 5/147; G06F 1/3275; G06F 3/0604; G06F 3/0647; G06F 3/0673
See application file for complete search history.

(56) References Cited

U.S. PATENT DOCUMENTS

| | | | |
|---|---|---|---|
| 2012/0271990 A1* | 10/2012 | Chen ...................... | G06F 12/00 711/103 |
| 2017/0075576 A1 | 3/2017 | Cho | |
| 2017/0242593 A1 | 8/2017 | Riley et al. | |
| 2017/0371776 A1 | 12/2017 | Riley et al. | |
| 2018/0004422 A1* | 1/2018 | Riley ..................... | G06F 3/0619 |
| 2018/0181325 A1* | 6/2018 | Woo ....................... | G06F 3/0619 |
| 2018/0181494 A1* | 6/2018 | Malladi ............... | G06F 12/0897 |
| 2018/0246643 A1 | 8/2018 | Jenne et al. | |
| 2018/0246790 A1 | 8/2018 | Sankaranarayanan et al. | |
| 2019/0012263 A1* | 1/2019 | Jenne .................... | G06F 3/0653 |

\* cited by examiner

*Primary Examiner* — Zahid Choudhury
(74) *Attorney, Agent, or Firm* — Brooks, Cameron & Huebsch, PLLC

(57) ABSTRACT

The present disclosure includes apparatuses and methods related to power management in memory. Memory devices with multiple input/output ports may have the ports separately managed to transfer data from the various to a host or other components of the module based on certain power management signaling or constraints. For example, a memory device with multiple ports may be managed to transfer data to a host from one set of ports in response to power management (or other) signaling, and the device may be managed to transfer other data to another memory device in response to different power management (or other signaling). Power management may be done onboard a memory module with or without direction from a host. Power management may be performed by a dedicated integrated circuit. Data may be transferred from or between different classes of memory devices, using different ports, based on power management, e.g., criteria.

24 Claims, 8 Drawing Sheets

POWER MANAGEMENT IN MEMORY

TECHNICAL FIELD

The present disclosure relates generally to memory devices, and more particularly, to apparatuses and methods for power management in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be uses as main memory in computing systems.

DETAILED DESCRIPTION

Figure 1A:
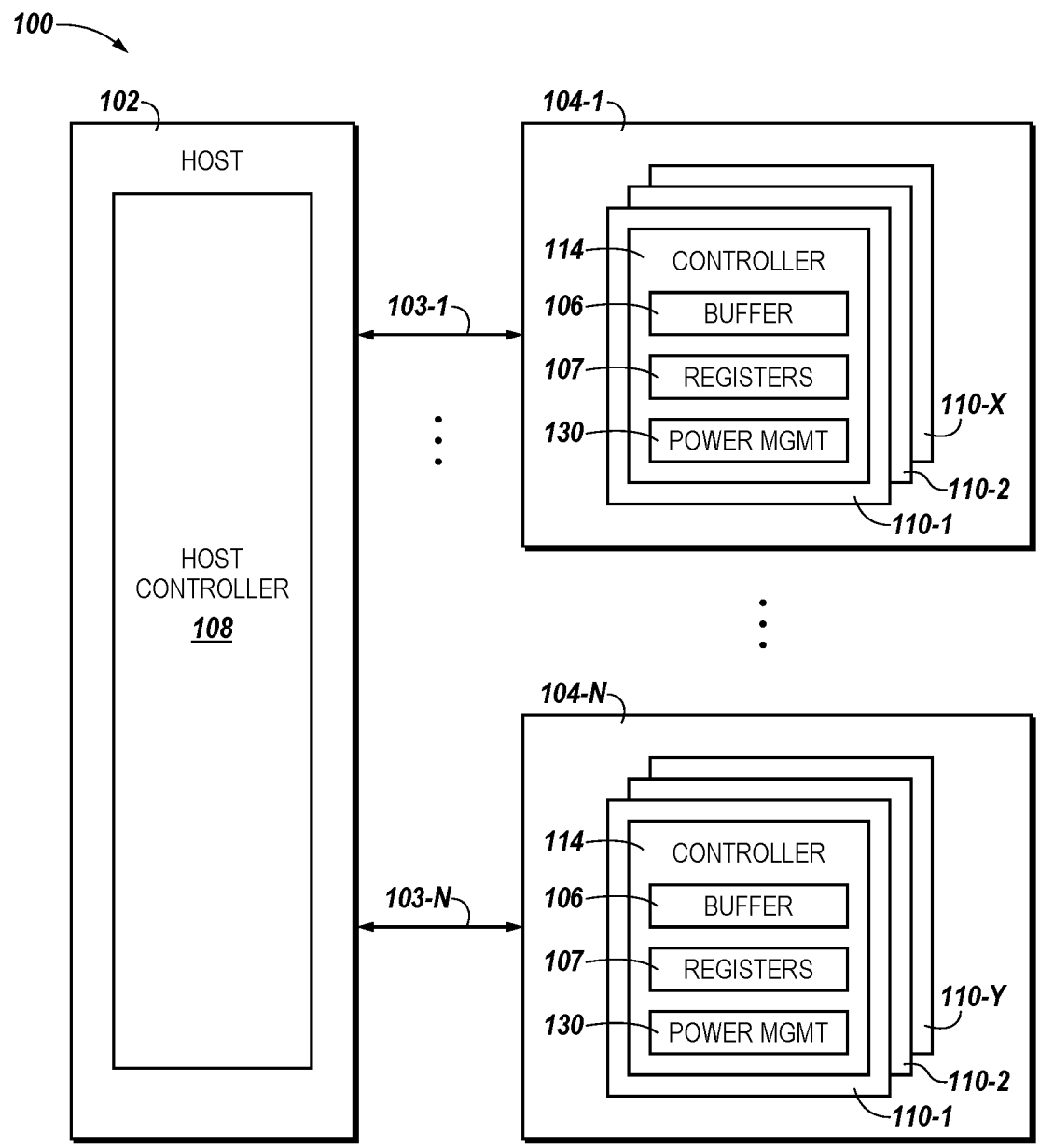
FIG. 1A is a block diagram of an apparatus in the form of a computing system including a memory system in accordance with a number of embodiments of the present disclosure.

The present disclosure includes apparatuses and methods related to power management in memory. An example apparatus can include a first number of memory devices coupled to a host via a first number of ports, wherein a first number of commands are executed via a first number of signals from a power management component to transfer a first data between the first number of memory devices and the host via the first number of ports and a second number of memory devices coupled to the first number of memory devices via a second number of ports, wherein a second number of commands via a second number of signals from the power management component are executed to transfer a second data between the first number of memory device and the second number of memory device via the second number of ports.

In a number of embodiments, a first number of memory devices of a DIMM can be coupled to a host via a first number of ports. Data can be transferred between the first number of memory devices and the host via the first number of ports in response to a first number of commands via a first number of signals from a power management component. In some examples, in response to a second number of commands via a second number of signals from the power management component, data can be transferred between the first number of memory devices and a second number of memory devices of the DIMM via a second number of ports in response to the second number of commands.

The power management component can convert a number of input signals into the first number of signals to be compatible with the first number of memory devices and the second number of signals to be compatible with the second number of memory devices. In some examples, the power management component can include a power management integrated circuit (PMIC) and/or a capacitive voltage divider (CVD).

The CVD can receive a primary supply signal from a primary power supply, convert the primary supply signal to a modified primary supply signal that is compatible with the operation of the PMIC, and send the modified primary supply signal to the PMIC. In some examples, the PMIC can include one or more regulators to convert the primary supply signal and/or the modified primary supply signal into the first number of signals and/or the second number of signals by increasing or decreasing the signals.

In a number of embodiments, the power management component can increase the efficiency of the DIMM. The power management component can modify and send tailored signal magnitudes to a memory device depending on the type of memory device. For example, the first number of memory devices can be DRAM and the second number of memory devices can be non-volatile memory (NVM). In this example, the DRAM may require a signal with greater magnitude than the NVM may require. As such, the power management component, when sending a signal to the NVM, may decrease the signal to save power, for example.

A memory system can include a dual in-line memory module (DIMM) having a number of memory devices. For example, a DIMM can be a non-volatile DIMM (NVDIMM) that includes a number of volatile memory devices and a number of non-volatile memory devices. A DIMM can execute commands to transfer data between the host and the volatile memory device, between the host and the non-volatile memory device, between the volatile and non-volatile memory devices, between non-volatile memory devices, and between volatile memory devices. The commands can be received by the DIMM from another device, such as a host, and/or can be generated by a controller on the DIMM.

For example, the number of volatile memory devices can be coupled to another device, such as a host, via a first port (e.g., an A Side Port) and be coupled to a controller on the DIMM via a second port (e.g., a B Side Port). The number of non-volatile memory devices can be coupled to the controller on the DIMM. The DIMM can execute commands to transfer data between another device, such as a host, and the volatile memory devices via an A Side Port and the DIMM can execute commands to transfer data between the volatile memory devices and the non-volatile memory devices via a B Side Port. The DIMM can execute the commands to transfer data between another device and the volatile memory devices while executing the commands to transfer data between the volatile memory device and the non-volatile memory devices.

The DIMM can include a number of embodiments where a port is not used to couple the volatile memory devices to other devices and/or the controller (e.g., a bus from a host and/or controller is coupled directly to the volatile memory devices). The DIMM can send a ready/wait signal to another device, such as a host, indicating whether or not the DIMM is ready to receive commands from the other device. For example, the DIMM can send a ready/wait signal to a host indicating the DIMM is not ready to receive commands from the host and is busy executing commands to transfer data between the memory devices on the DIMM. The DIMM can send a ready/wait signal to a host indicating the DIMM is ready to receive commands from the host when the DIMM is not busy executing commands to transfer data between the memory device on the DIMM. In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include a one or more dual in-line memory modules (DIMM) 110-1, . . . , 110-X, 110-Y. The DIMMs 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. The examples described below in association with FIGS. 1A-7 use a DIMM as the memory module, but the embodiments of the present disclosure can be used on any memory system that include volatile and/or non-volatile memory. In FIG. 1A, memory system 104-1 is coupled to the host via channel 103-1 can include DIMMs 110-1, . . . , 110-X, where DIMM 110-1 is a NVDIMM and 110-X is DRAM DIMM. In this example, each DIMM 110-1, . . . , 110-X, 110-Y includes a controller 114. Controller 114 can receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device. The host 102 can send commands to the DIMMs 110-1, . . . , 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1A, a host 102 can be coupled to the memory systems 104-1 . . . 104-N. In a number of embodiments, each memory system 104-1 . . . 104-N can be coupled to host 102 via a channel (e.g., channels 103-1, . . . , 103-N). In FIG. 1A, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . , 110-X, 110-Y via channels 103-1 . . . 103-N. The host controller 108 can communicate with the DIMMs 110-1, . . . , 110-X, 110-Y and/or the controller 114 on each of the DIMMs 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between 102 and DIMMs 110-1, . . . , 110-X, 110-Y on a number of buses, such as a data bus and/or an address bus, for example, via channels 103-1 . . . 103-N.

The host controller 108 and/or controller 114 on a DIMM can include control circuitry, e.g., hardware, firmware, and/or software. In one or more embodiments, the host controller 108 and/or controller 114 can be an application specific integrated circuit (ASIC) and/or a field programmable gate array (FPGA) coupled to a printed circuit board including a physical interface. Also, each DIMM 110-1, . . . , 110-X, 110-Y can include buffers 116 of volatile and/or non-volatile memory, registers 107, and a power management component 130. Buffer 106 can be used to buffer data that is used during execution of commands.

In a number of embodiments, the DIMM 110-1, . . . , 110-X, 110-Y can include a first number of memory devices and a second number of memory devices coupled to the controller 114. The DIMM 110-1, . . . , 110-X, 110-Y can be configured to receive a first number of commands via a first number of signals. The first number of signals can be from the power management component 130.

The power management component 130 can convert a number of input signals into the first number of signals to be compatible with the first number of memory devices. In some examples, the power management component 130 can include a power management integrated circuit (PMIC) and/or a capacitive voltage divider (CVD).

The first number of commands can be executed on a first portion of the first number of memory devices via a first number of ports, for example. The DIMM 110-1, . . . , 110-X, 110-Y can be configured to receive a second number of commands via a second number of signals from the power management component 130. The second number of commands can be executed on a second portion of the first number of memory devices via a second number of ports.

In a number of embodiments, the DIMM 110-1, . . . , 110-X, 110-Y can include a second number of memory devices. The DIMM 110-1, . . . , 110-X, 110-Y can receive a third number of commands via a third number of signals from the power management component 130 for execution on a first portion of the second number of memory devices via a second number of ports, for example.

The DIMMs 110-1, . . . , 110-X, 110-Y can provide main memory for the memory system or could be used as additional memory or storage throughout the memory system. Each DIMM 110-1, . . . , 110-X, 110-Y can include one or more arrays of memory cells on memory dies, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the DIMMs 110-1, . . . , 110-X, 110-Y. It will be appreciated by those skilled in the art that the number of address input connections can depend on the density and architecture of the DIMMs 110-1, . . . , 110-X, 110-Y.

Figure 1B:
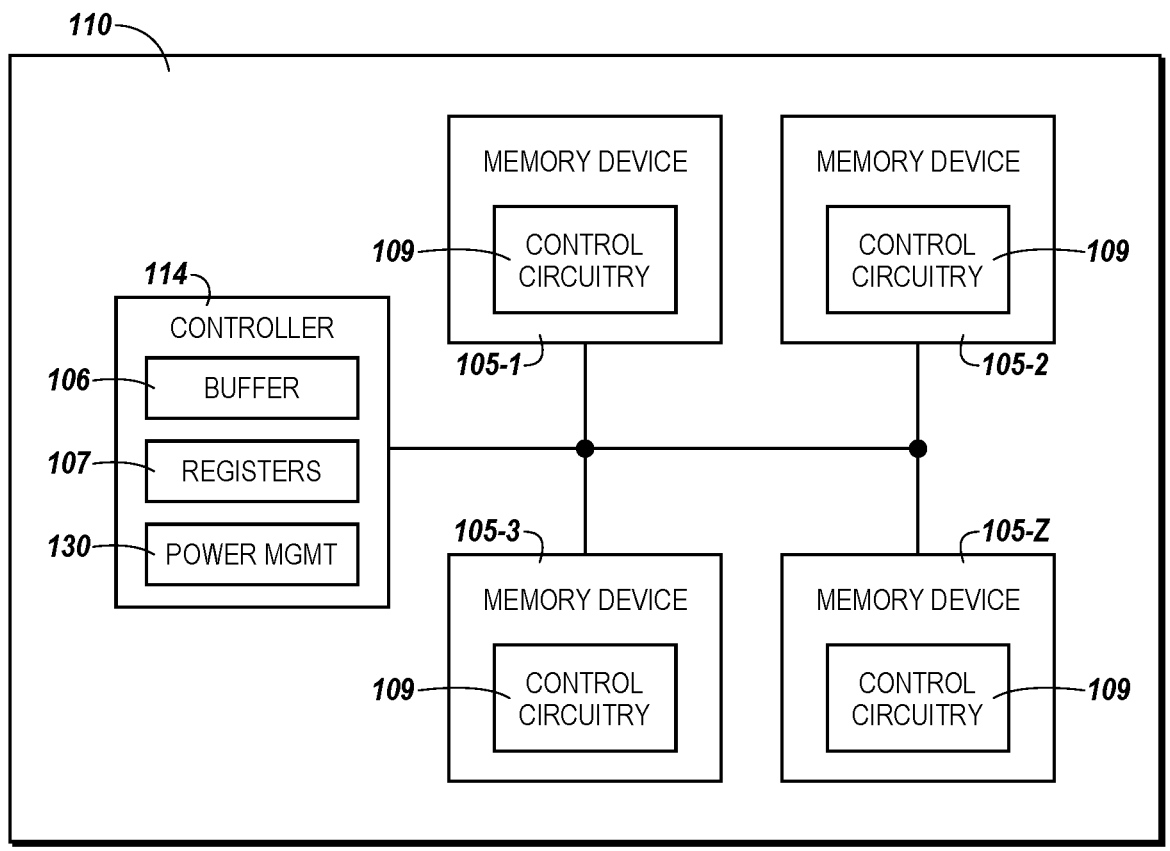
FIG. 1B is a block diagram of an apparatus in the form of a dual in-line memory modules (DIMM) in accordance with a number of embodiments of the present disclosure.

FIG. 1B is a block diagram of an apparatus in the form of a dual in-line memory modules (DIMM) 110 in accordance with a number of embodiments of the present disclosure. In FIG. 1B, DIMM 110 can include a controller 114. Controller 114 can include memory, such as SRAM memory, that can be a buffer 106, a number of registers 107, and a power management component 130. DIMM 110 can include a number of memory devices 105-1, . . . , 105-Z coupled to the controller. Memory devices 105-1, . . . , 105-Z can be volatile and/or non-volatile memory devices, such as memory devices 221 and 224 in FIG. 2, and include non-volatile memory arrays and/or volatile memory arrays. Memory devices 105-1, . . . , 105-Z can include control circuitry 109 (e.g., hardware, firmware, and/or software) which can be used to execute commands on the memory devices 105-1, . . . , 105-Z. The control circuitry 109 can receive commands from controller 114. The control circuitry 109 can be configured to execute commands to read and/or write data in the memory devices 105-1, . . . , 105-Z.

Figure 2:
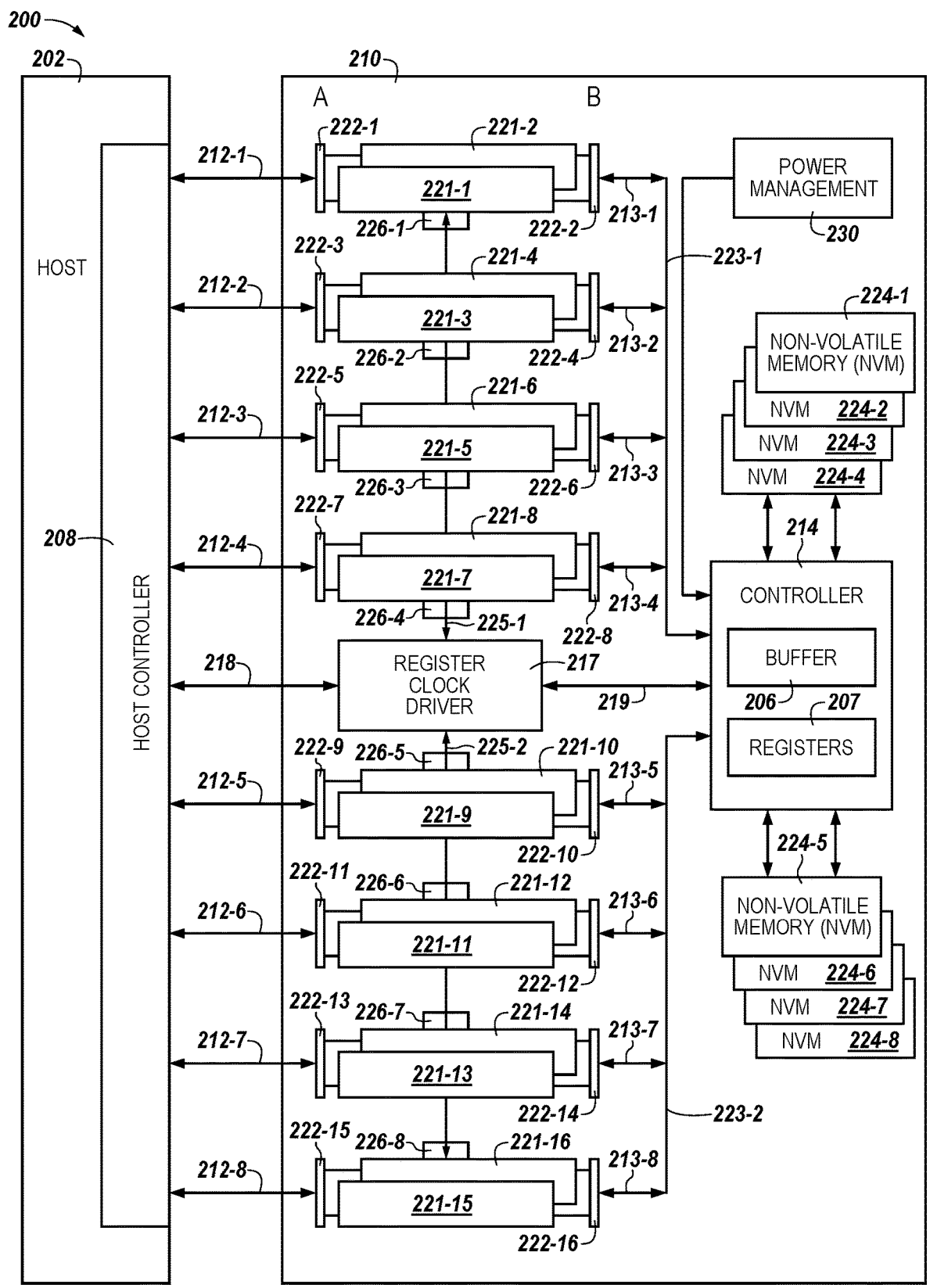
FIG. 2 is a block diagram of a computing system including a host and a memory system comprising a dual in-line memory module (DIMM) with ports in accordance with a number of embodiments of the present disclosure.

FIG. 2 is a block diagram of a computing system 200 including a host 202 and a memory system comprising a dual in-line memory module (DIMM) 210 with ports in accordance with a number of embodiments of the present disclosure. In FIG. 2, host 202 is coupled to DIMM 210 via data buses 212-1, . . . , 212-16 and command/address buses 218-1 and 218-2. Host 202 can be coupled to DIMM 210 via a number of channels (e.g., channels 103-1, . . . , 103-N in FIG. 1A). For example, host 202 is coupled to DIMM 210 via a first channel that includes data buses 212-1, . . . , 212-4 and command/address bus 218 and host 202 is coupled to DIMM 210 via a second channel that includes data buses 212-5, . . . , 212-8 and command address/bus 2188. Host 202 can send commands on the first channel for execution on memory devices 221-1, . . . , 221-8 and memory devices 224-1, . . . , 224-4 and can send commands on the second channel for execution on memory devices 221-9, . . . , 221-16 and memory devices 224-5, . . . , 224-8. Controller 214 can receive commands from host 202. The commands from host 202 can be sent to register clock driver (RCD) 217 via bus 218 and the commands can be sent from RCD 217 to controller 214 via bus 219. The controller 214 can receive the commands from RCD 217 and store data associated with the commands (e.g., command instructions and/or data read from and/or to be written to memory devices 221 and/or 224 during execution of the commands) in buffer 206. Controller 214 can send a signal to RCD 217 indicating which memory device of a pair of memory devices (e.g., memory device 221-1 or 221-2, for example) will execute the command. The signal can be sent from RCD 217 to multiplexor 226-1, . . . , 226-8 and cause multiplexor 226-1, . . . , 226-8 to select a memory device from a pair of memory devices and couple the selected memory device to RCD 217 via bus 225-1 and/or 225-2. For example, if the command is transferring data via an A side port and the A side port is coupling memory device 221-1 to host 202, while the B side port is coupling memory device 221-2 to controller 214, the signal can indicate to multiplexor 226-1 to couple bus 225-1 to memory device 221-1. The controller can then send the command to memory device 221-1 on bus 225-1 via RCD 217 and memory device 221-1 can execute the command by transferring data between memory device 221-1 and host 202. Memory devices 221-1, . . . , 221-16 can send signals, (e.g., command completion signals) on buses 225-1 and 225-2 to RCD 217 and controller 214 that indicate memory devices 221-1, . . . , 221-16 have completed execution of commands and are ready for additional commands. Once a command has been executed, controller 214 can send another command to RCD 217 for execution and/or a status signal to the host 202 indicating that the command received from host 202 has been executed. Controller 214 can include non-volatile and/or volatile memory, such as SRAM memory, that can be a buffer 206, a register 207 used during execution of commands, and/or a power management component 230. In some examples, the power management component 230 can be outside of, but coupled to the controller 214, as shown in FIG. 2.

DIMM 210 can include a first number of memory devices 221-1, . . . , 221-16. For example, memory devices 221-1, . . . , 221-16 can be DRAM memory devices, among other types of volatile and/or non-volatile memory. The DRAM memory devices 221-1, . . . , 221-16 can be paired together. For example, DRAM memory devices 221-1 and 221-2 are paired together, coupled to the host via port 222-1 (A Side Port) and buses 212-1 and 212-2, and coupled to controller 214 via port 222-2 (B Side Port) and buses 213-1, 213-2, 223-1, and 223-2. DRAM memory devices 221-3 and 221-4 are paired together, coupled to the host via port 222-3 (A Side Port) and buses 212-3 and 212-4, and coupled to controller 214 via port 222-4 (B Side Port) and buses 213-3, 213-4, 223-1, and 223-2. DRAM memory devices 221-5 and 221-6 are paired together, coupled to the host via port 222-5 (A Side Port) and buses 212-5 and 212-6, and coupled to controller 214 via port 222-6 (B Side Port) and buses 213-5, 213-6, 223-1, and 223-2. DRAM memory devices 221-7 and 221-8 are paired together, coupled to the host via port 222-7 (A Side Port) and buses 212-7 and 212-8, and coupled to controller 214 via port 222-8 (B Side Port) and buses 213-7, 213-8, 223-1, and 223-2. DRAM memory devices 221-9 and 221-10 are paired together, coupled to the host via port 222-9 (A Side Port) and buses 212-9 and 212-10, and coupled to controller 214 via port 222-10 (B Side Port) and buses 213-9, 213-10, 223-3, and 223-4. DRAM memory devices 221-11 and 221-12 are paired together, coupled to the host via port 222-11 (A Side Port) and buses 212-11 and 212-12, and coupled to controller 214 via port 222-12 (B Side Port) and buses 213-11, 213-12, 223-3, and 223-4. DRAM memory devices 221-13 and 221-14 are paired together, coupled to the host via port 222-13 (A Side Port) and buses 212-13 and 212-14, and coupled to controller 214 via port 222-14 (B Side Port) and buses 213-13, 213-14, 223-3, and 223-4. DRAM memory devices 221-15 and 221-16 are paired together, coupled to the host via port 222-15 (A Side Port) and buses 212-15 and 212-16, and coupled to controller 214 via port 222-16 (B Side Port) and buses 213-15, 213-16, 223-3, and 223-4.

DIMM 210 can include a second number of memory devices 224-1, . . . , 224-8. For example, memory devices 221-1, . . . , 221-8 can be 3D XPoint memory devices, among other types of volatile and/or non-volatile memory.

Memory system 200 can be configured to execute commands sent from host 202 to DIMM 210 by sending command/address information from the host controller 208 on command/address busses 213-1 and 213-2 to the register clock driver (RCD) 217 and data on data buses 212-1, . . . , 212-16. The commands from the host can include address information for memory devices 221-1, . . . 221-16 where the host is requesting an operation on data at a particular location in memory devices 221-1, . . . 221-16. The commands from the host can include address information for memory devices 224-1, . . . , 224-8 where the host is requesting an operation on data at particular location in memory devices 224-1, . . . , 224-8, while memory devices 221-1, . . . 221-16 can act as a buffer during execution of the commands.

In a number of embodiments, memory devices 221-1, . . . 221-16 can be configured as cache. For example, memory devices can be configured as cache for the data stored in memory devices 224-1, . . . , 224-8 and/or other memory devices coupled to the computing system. The DIMM 210 can be configured to have a portion of memory devices 221-1, . . . 221-16 addressable by host 202 and a portion of the memory devices 221-1, . . . 221-16 configured as cache.

DIMM 210 includes memory devices that are paired together and one of the paired memory devices can be selected for coupling to host 202 via an A Side Port and the other of the paired memory device can be selected for coupling to controller 214 via a B Side Port. For example, memory devices 221-1, which is paired with memory device 221-2, can be selected for coupling to host 202 via port 222-1, while memory device 221-2 can be selected for coupling to controller 214 via port 222-2. Port 222-1 can include a multiplexor to select and couple memory device 221-1 to host 202 while isolating memory device 221-2 from host 202. Port 222-2 can include a multiplexor to select and couple memory device 221-2 to controller 214 while isolating memory device 221-1 from controller 214. Host 202 can send command to DIMM 210 for execution on the selected A Side Port memory device (e.g., memory device 221-1). The commands can be executed by transferring data between host 202 and memory device 221-1 via port 222-1 on buses 212-1 and/or 212-2. DIMM 210 can also execute commands for execution on the selected B Side Port memory device (e.g., memory device 221-2). The commands can be executed by transferring data between memory device 221-2 and other memory devices via port 222-1 and controller 214 on buses 212-1, 212-2, 223-1, and/or 223-2. Commands executed using the B Side Port can transfer data between memory devices 221-1, . . . , 221-16 and/or between memory devices 221-1, . . . , 221-16 and memory devices 224-1, . . . , 224-8. Ports 222-1, . . . , 22-16 can be external to memory devices 221-1, . . . , 221-16 as illustrated in FIG. 2.

In a number of embodiments, commands that transfer data via the A Side Ports can be executed while commands that transfer data via the B Side Ports. The data that is stored in pairs memory devices can be arbitrated and reconciled by the controller. Memory devices that have executed commands where data was transferred to and/or from one of the memory devices on the A Side Port and to and/or from the other paired memory device on the B Side Port can have the data on the pair of memory device reconciled by transferring data between the pair of memory devices and/or between the pair of memory devices and memory devices 224-1, . . . , 224-8. For example, after A Side Port and B Side Port transfers have occurred on a pair of memory devices and DIMM 210 is idle, controller 214 can send commands to reconcile the data stored on the pair of memory devices so that the same data is stored on each of the memory devices by transferring data between the pair of memory devices and/or between the pair of memory devices and memory devices 224-1, . . . , 224-8.

In a number of embodiments, commands can be received from host 202 and/or generated by controller 214 to transfer data between memory devices 224-1, . . . , 224-8. Data can be transferred between memory devices 224-1, . . . , 224-8 via controller 214 using buffer 206 and/or registers 207.

In some examples, the memory devices 221-1, . . . , 221-16 can be coupled to the host 202 via A Side Ports. Data can be transferred between the memory devices 221-1, . . . , 221-16 and the host 202 via A Side Ports in response to a first number of commands via a first number of signals from the power management component 230. For example, data can be transferred between the memory device 221-1 and the host 202 via an A Side Port 222-1.

In a number of embodiments, the memory devices 224-1, . . . , 224-8 can be coupled to the memory devices 221-1, . . . , 221-16 via B Side Ports. Data can be transferred between the memory devices 221-1, . . . , 221-16 and the memory devices 224-1, . . . , 224-8 via B Side Ports in response to a second number of commands via a second number of signals from the power management component 230. Data can be transferred between the memory device 221-1 and the memory device 224-1 via B Side Port 213-1, for example.

The power management component 230 can convert a number of input signals into the first number of signals to be compatible with the first number of memory devices 221-1, . . . , 221-16 and/or the second number of signals to be compatible with the second number of memory devices 224-1, . . . , 224-8. In some examples, the number of input signals can be increased or decreased to create the first number of signals and/or the second number of signals.

In a number of embodiments, the first number of signals 221-1, . . . , 224-16 and the second number of signals 224-1, . . . , 224-8 can be voltages. In some examples, the first number of signals 221-1, . . . , 224-16 and the second number of signals 224-1, . . . , 224-8 can be different signals and/or different voltages.

Figure 3:
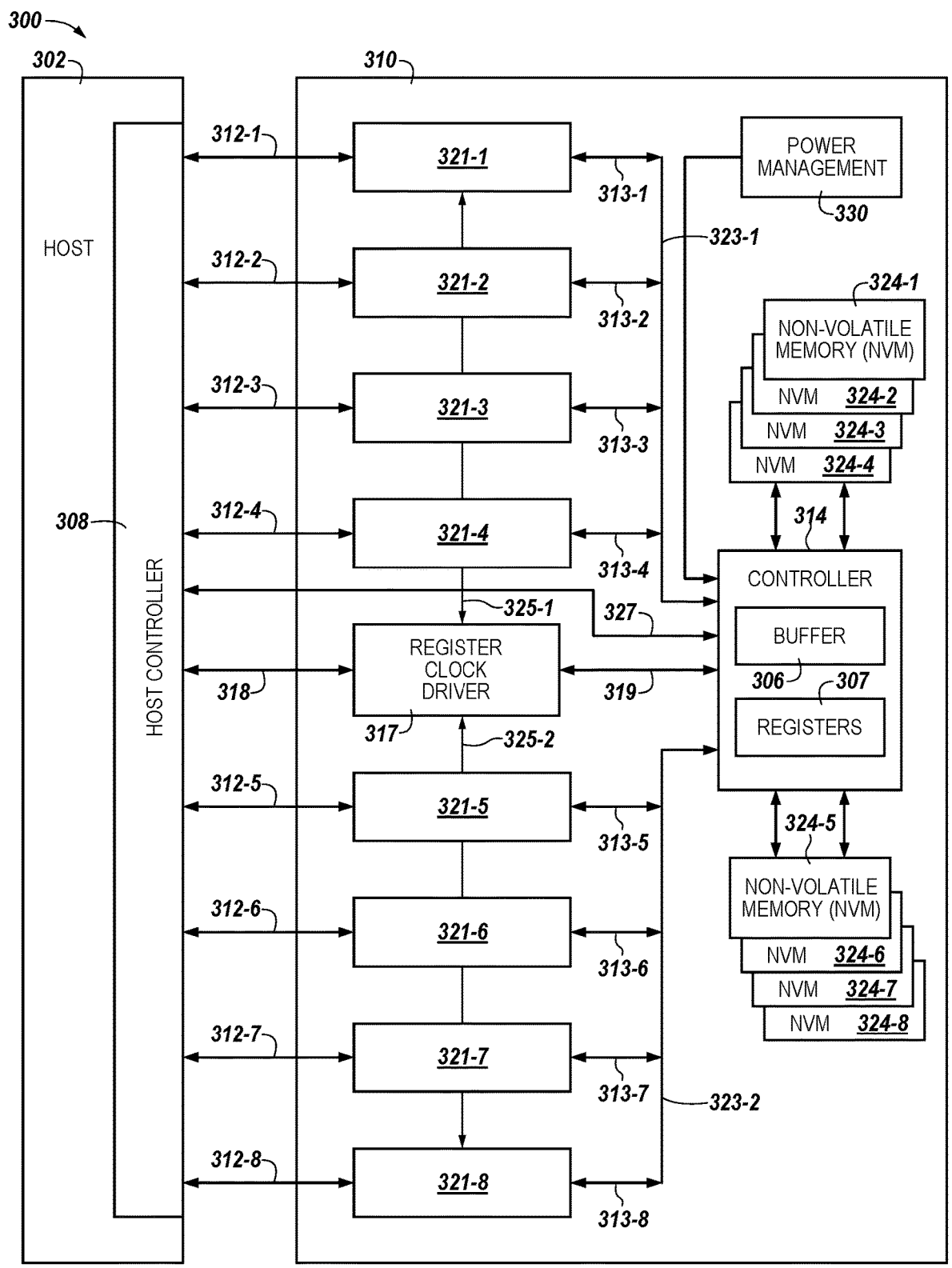
FIG. 3 is a block diagram of a computing system including a host and a memory system comprising a dual in-line memory module (DIMM) with a ready/busy bus in accordance with a number of embodiments of the present disclosure.

FIG. 3 is a block diagram of a computing system 300 including a host 302 and a memory system comprising a dual in-line memory module (DIMM) 310 with a ready/busy bus in accordance with a number of embodiments of the present disclosure. In FIG. 3, host 302 is coupled to DIMM 310 via data buses 312-1, . . . , 312-16, command/address bus 318, and ready/busy bus 327. Host 302 can be coupled to DIMM 310 via a number of channels (e.g., channels 103-1, . . . , 103-N in FIG. 1A). For example, host 302 is coupled to DIMM 310 via a first channel that includes data buses 312-1, . . . , 312-4, command/address bus 318, and ready/busy bus 327; and host 302 is coupled to DIMM 310 via a second channel that includes data buses 312-5, . . . , 312-8, command address/bus 318, and ready/busy bus 327.

DIMM 310 can include a first number of memory devices 321-1, . . . , 321-8. For example, memory devices 321-1, . . . , 321-16 can be DRAM memory devices, among other types of volatile and/or non-volatile memory. DIMM 310 can include a second number of memory devices 324-1, . . . , 324-8. For example, memory devices 321-1, . . . , 321-8 can be 3D XPoint memory devices, among other types of volatile and/or non-volatile memory.

Controller 314 can send a ready/busy signal to host 302 on the ready/busy bus 327. The ready/busy signal can indicate to host 302 whether or not the controller is ready to receive commands from host 302. For example, if DIMM 310 is busy executing commands, such as transferring data between memory devices 321-1, . . . , 321-4 and memory devices 324-1, . . . , 324-4, for example, the DIMM and is not ready to receive commands, so a ready/busy signal can be sent on ready/busy bus 327 to host 302 that indicates DIMM 310 is not ready to receive commands. Once DIMM 310 is no longer busy executing commands DIMM 310 can send a ready/busy signal on ready/busy bus 327 to host 302 indicating DIMM 310 is ready to receive commands from host 302. Host 302 can send commands to DIMM 310 in response to receiving the ready/busy signal.

Controller 314 can receive commands from host 302. The commands from host 302 can be sent to register clock driver (RCD) 317 via bus 318 and the commands can be sent from RCD 317 to controller 314 via bus 319. Controller 314 can receive the commands from RCD 317 and store data associated with the commands (e.g., command instructions and/or data read from and/or to be written to memory devices 321 and/or 324 during execution of the commands) in buffer 306. The controller can send the commands to memory devices 321-1, . . . , 321-8 on bus 325-1 and/or 325-2 via RCD 317 and memory devices 321-1, . . . , 321-8 can execute the commands by transferring data between memory devices 321-1, . . . , 321-8 and host 302 and/or memory devices 321-1, . . . , 321-8 and memory device 324-1, . . . , 324-8. Memory devices 321-1, . . . , 321-8 can send signals on buses 325-1 and 325-2 to RCD 317 and controller 314 that indicate memory devices 321-1, . . . , 321-8 have completed execution of commands and are ready for additional commands. Once a command has been executed, controller 314 can send a status signal to the host 302 indicating that the command received from host 302 has been executed. Controller 314 can include non-volatile and/or volatile memory, such as SRAM memory, that can be a buffer 306, a register 307 used during execution of commands, and a power management component 330.

Memory system 300 can be configured to execute commands sent from host 302 to DIMM 310 by sending command/address information from the host controller 308 on command/address bus 318 to the register clock driver (RCD) 317 and data on data buses 312-1, . . . , 312-8. The commands from the host can include address information for memory devices 321-1, . . . 321-8 where the host is requesting an operation on data at particular location in memory devices 321-1, . . . 321-16. The commands from the host can include address information for memory devices 324-1, . . . , 324-4 where the host is requesting an operation on data at particular location in memory devices 324-1, . . . , 324-4, while memory devices 321-5, . . . 321-8 can act as a buffer during execution of the commands.

In a number of embodiments, memory devices 321-1, . . . 321-8 can be configured as cache. For example, memory devices can be configured as cache for the data stored in memory devices 324-1, . . . , 324-8 and/or other memory devices coupled to the computing system. The DIMM 310 can be configured to have a portion of memory devices 321-1, . . . 321-8 addressable by host 302 and a portion of the memory devices 321-1, . . . 321-8 configured as cache.

In a number of embodiments, commands can be received from host 302 and/or generated by controller 314 to transfer data between memory devices 324-1, . . . , 324-8. Data can be transferred between memory devices 324-1, . . . , 324-8 via controller 314 using buffer 306 and/or registers 307.

Figure 4:
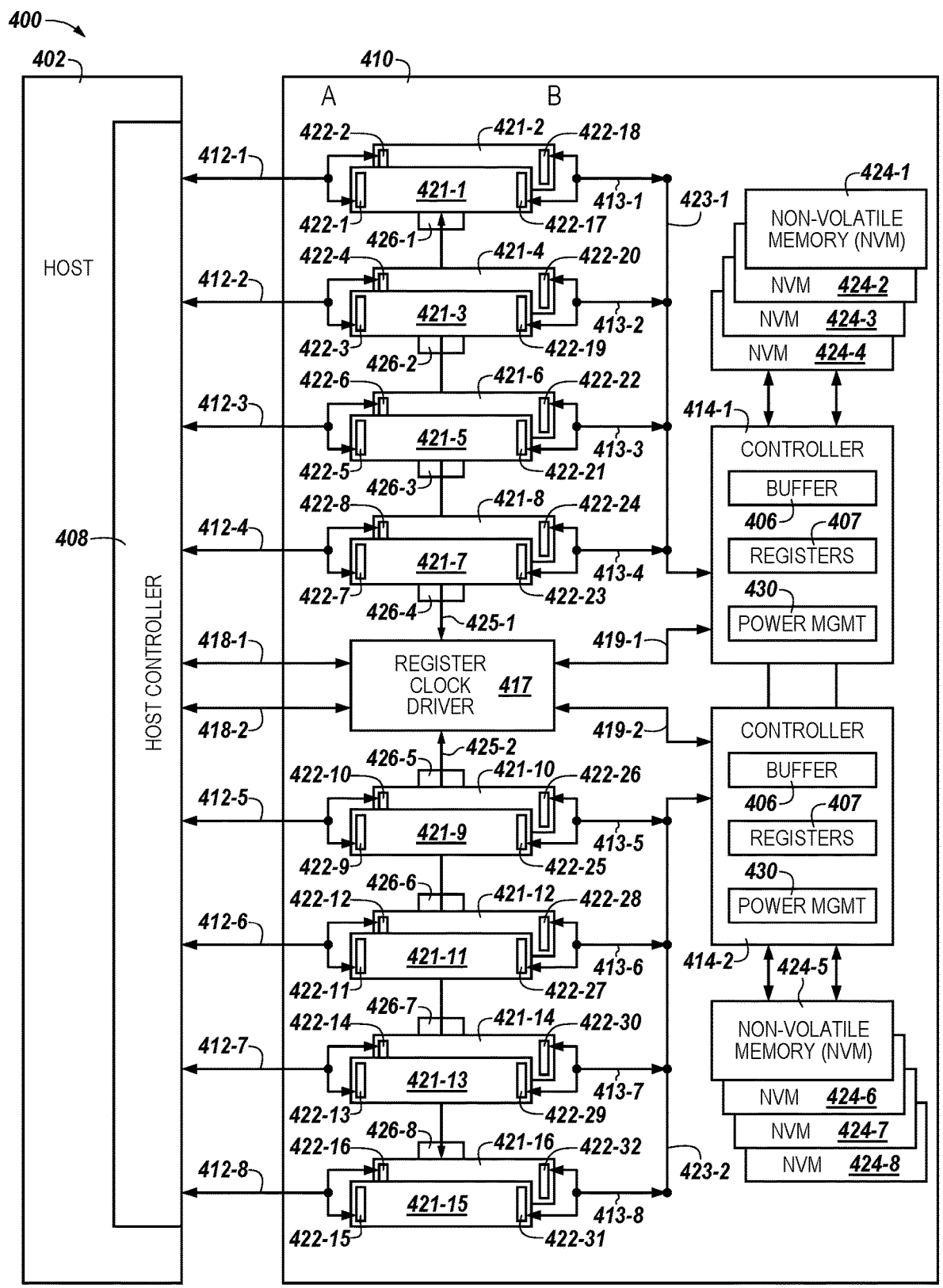
FIG. 4 is a block diagram of a computing system including a host and a memory system comprising a dual in-line memory module (DIMM) with a first and second controller in accordance with a number of embodiments of the present disclosure.

FIG. 4 is a block diagram of a computing system 400 including a host 402 and a memory system comprising a dual in-line memory module (DIMM) 410 with a first and second controller in accordance with a number of embodiments of the present disclosure. In FIG. 2, host 402 is coupled to DIMM 210 via data buses 412-1, . . . , 412-8 and command/address buses 418-1 and 418-2. Host 402 can be coupled to DIMM 410 via a number of channels (e.g., channels 103-1, . . . , 103-N in FIG. 1A). For example, host 402 is coupled to DIMM 410 via a first channel that includes data buses 412-1, . . . , 412-4 and command/address bus 418-1 and host 402 is coupled to DIMM 410 via a second channel that includes data buses 412-5, . . . , 412-9 and command address/bus 418-2. Host 402 can send commands on the first channel for execution on memory devices 421-1, . . . , 421-8 and memory devices 424-1, . . . , 424-4 and can send commands on the second channel for execution on memory devices 421-9, . . . , 421-16 and memory devices 424-5, . . . , 424-8. Controller 414-1 can receive commands from host 402 on channel 1 and controller 414-2 can receive commands from 402 on channel 2. The commands from host 402 can be sent to register clock driver (RCD) 217 via buses 418-1 and/or 418-2 and the commands can be sent from RCD 217 to controller 414-1 via bus 419-1 and controller 414-2 via bus 419-2.

DIMM 410 can include controller 414-1 and 414-2. Controller 414-1 can be coupled to and send signals to control operation of memory devices 421-1, . . . , 421-8 and memory devices 424-1, . . . , 424-4. Controller 414-2 can be coupled to and send signals to control operation of memory devices 421-9, . . . , 421-16 and memory devices 424-8, . . . , 424-8. DIMM 410 with controllers 414-1 and 414-2 can allow memory devices 421-1, . . . , 421-8 and memory devices 424-1, . . . , 424-4 to operation independently from memory devices 421-9, . . . , 421-16 and memory devices 424-8, . . . , 424-8. Controller 414-1 is coupled to controller 414-2 can data can be transferred between controller 414-1 and 414-2. Therefore controller 414-1 can operate memory devices 421-1, . . . , 421-8 and memory devices 424-1, . . . , 424-4 independently from other memory device and also transfer data from memory devices 421-1, . . . , 421-8 and memory devices 424-1, . . . , 424-4 to other memory devices, such as memory devices 421-9, . . . , 421-16 and memory devices 424-8, . . . , 424-8.

The controller 414 can receive the commands from RCD 417 and store data associated with the commands (e.g., command instructions and/or data read from and/or to be written to memory devices 421 and/or 424 during execution of the commands) in buffer 406. Controller 414 can send a signal to RCD 417 indicating which memory device of a pair of memory devices (e.g., memory device 421-1 or 421-2, for example) will execute the command. The signal can be sent from RCD 217 to multiplexor 426-1, . . . , 426-8 and cause multiplexor 426-1, . . . , 426-8 to select a memory device from a pair of memory devices and couple the selected memory device to RCD 417 via bus 425-1 and/or 425-2. For example, if the command is transferring data via an A side port and the A side port is coupling memory device 421-1 to host 402, while the B side port is coupling memory device 421-2 to controller 414, the signal can indicate to multiplexor 426-1 to couple bus 425-1 to memory device 421-1. The controller can then send the command to memory device 421-1 on bus 425-1 via RCD 417 and memory device 421-1 can execute the command by transferring data between memory device 421-1 and host 402. Memory devices 421-1, . . . , 421-16 can send signals on buses 425-1 and 425-2 to RCD 417 and controller 414 that indicate memory devices 421-1, . . . , 421-16 have completed execution of commands and are ready for additional commands. Once a command has been executed, controller 414 can send a status signal to the host 402 indicating that the command received from host 402 has been executed. Controllers 414-1 and 414-2 can include non-volatile and/or volatile memory, such as SRAM memory, that can be a buffer 406, a register 407 used during execution of commands, and/or a power management component 430.

DIMM 410 can include a first number of memory devices 421-1, . . . 421-16. For example, memory devices 421-1, . . . 421-16 can be DRAM memory devices, among other types of volatile and/or non-volatile memory. The DRAM memory devices 421-1, . . . 421-16 can be paired together. For example, DRAM memory devices 421-1 and 421-2 are paired together, coupled to the host via port 422-1 (A Side Port) and buses 412-1 and 412-2, and coupled to controller 414-1 via port 422-2 (B Side Port) and buses 413-1, 413-2, 423-1, and 423-2. DRAM memory devices 421-3 and 421-4 are paired together, coupled to the host via port 422-3 (A Side Port) and buses 412-3 and 412-4, and coupled to controller 414-1 via port 422-4 (B Side Port) and buses 413-3, 413-4, 423-1, and 423-2. DRAM memory devices 421-5 and 421-6 are paired together, coupled to the host via port 422-5 (A Side Port) and buses 412-5 and 412-6, and coupled to controller 414-1 via port 422-6 (B Side Port) and buses 413-5, 413-6, 423-1, and 423-2. DRAM memory devices 421-7 and 421-8 are paired together, coupled to the host via port 422-7 (A Side Port) and buses 412-7 and 412-8, and coupled to controller 414-1 via port 422-8 (B Side Port) and buses 413-7, 413-8, 423-1, and 423-2. DRAM memory devices 421-9 and 421-10 are paired together, coupled to the host via port 422-9 (A Side Port) and buses 412-9 and 412-10, and coupled to controller 414-2 via port 422-10 (B Side Port) and buses 413-9, 413-10, 423-3, and 423-4. DRAM memory devices 421-11 and 421-12 are paired together, coupled to the host via port 422-11 (A Side Port) and buses 412-11 and 412-12, and coupled to controller 414-2 via port 422-12 (B Side Port) and buses 413-11, 413-12, 423-3, and 423-4. DRAM memory devices 421-13 and 421-14 are paired together, coupled to the host via port 422-13 (A Side Port) and buses 412-13 and 412-14, and coupled to controller 414-2 via port 422-14 (B Side Port) and buses 413-13, 413-14, 423-3, and 423-4. DRAM memory devices 421-15 and 421-16 are paired together, coupled to the host via port 422-15 (A Side Port) and buses 412-15 and 412-16, and coupled to controller 414-2 via port 422-16 (B Side Port) and buses 413-15, 413-16, 423-3, and 423-4.

DIMM 410 can include a second number of memory devices 424-1, . . . 424-8. For example, memory devices 421-1, . . . 421-8 can be 3D)(Point memory devices, among other types of volatile and/or non-volatile memory.

Memory system 400 can be configured to execute commands sent from host 402 to DIMM 410 by sending command/address information from the host controller 408 on command/address busses 413-1 and 413-2 to the register clock driver (RCD) 417 and data on data buses 412-1, . . . , 412-16. The commands from the host can include address information for memory devices 421-1, . . . 421-16 where the host is requesting an operation on data at particular location in memory devices 421-1, . . . 421-16. The commands from the host can include address information for memory devices 424-1, . . . , 424-8 where the host is requesting an operation on data at particular location in memory devices 424-1, . . . , 424-8, while memory devices 421-1, . . . 421-16 can act as a buffer during execution of the commands.

In a number of embodiments, memory devices 421-1, . . . 421-16 can be configured as cache. For example, memory devices can be configured as cache for the data stored in memory devices 424-1, . . . , 424-8 and/or other memory devices coupled to the computing system. The DIMM 410 can be configured to have a portion of memory devices 421-1, . . . 421-16 addressable by host 402 and a portion of the memory devices 421-1, . . . 421-16 configured as cache.

DIMM 410 includes memory devices that are paired together and one of the paired memory devices can be selected for coupling to host 402 via an A Side Port and the other of the paired memory device can be selected for coupling to controller 414 via a B Side Port. For example, memory devices 421-1, which is paired with memory device 421-2, can be selected for coupling to host 402 via port 422-1, while memory device 421-2 can be selected for coupling to controller 414-1 via port 422-2. Port 422-1 can include a multiplexor to select and couple memory device 421-1 to host 402 while isolating memory device 421-2 from host 402. Port 422-2 can include a multiplexor to select and couple memory device 421-2 to controller 414-1 while isolating memory device 421-1 from controller 414. Host 402 can send command to DIMM 210 for execution on the selected A Side Port memory device (e.g., memory device 421-1). The commands can be executed by transferring data between host 402 and memory device 421-1 via port 422-1 on buses 412-1 and/or 412-2. DIMM 410 can also execute commands for execution on the selected B Side Port memory device (e.g., memory device 421-2). The commands can be executed by transferring data between memory device 421-2 and other memory devices via port 422-1 and controller 414-1 on buses 412-1, 412-2, 423-1, and/or 423-2. Commands executed using the B Side Port can transfer data between memory devices 421-1, . . . , 421-16 and/or between memory devices 421-1, . . . , 421-16 and memory devices 424-1, . . . , 424-8. Ports 422-1, . . . , 422-32 can be external to memory devices 421-1, . . . , 421-16 as illustrated in FIG. 4.

In a number of embodiments, commands that transfer data via the A Side Ports can be executed while commands that transfer data via the B Side Ports. The data that is stored in pairs memory devices can be arbitrated and reconciled by the controller. Memory devices that have executed commands where data was transferred to and/or from one of the memory devices on the A Side Port and to and/or from the other paired memory device on the B Side Port can have the data on the pair of memory device reconciled by transferring data between the pair of memory devices and/or between the pair of memory devices and memory devices 424-1, . . . , 424-8. For example, after A Side Port and B Side Port transfers have occurred on a pair of memory devices and DIMM 210 is idle, controllers 414-1 and 414-2 can send commands to reconcile the data stored on the pair of memory devices so that the same data is stored on each of the memory devices by transferring data between the pair of memory devices and/or between the pair of memory devices and memory devices 424-1, . . . , 424-8.

In a number of embodiments, commands can be received from host 402 and/or generated by controllers 414-1 and 414-2 to transfer data between memory devices 424-1, . . . , 424-8. Data can be transferred between memory devices 424-1, . . . , 424-8 via controllers 414-1 and 414-2 using buffer 406 and/or registers 407.

In some examples, the memory devices 421-1, . . . , 421-8 can be coupled to the host 402 via A Side Ports. Data can be transferred between the memory devices 421-1, . . . , 421-8 and the host 402 via A Side Ports in response to a first number of commands via a first number of signals from the power management component 430 of controller 414-1. For example, data can be transferred between the memory device 421-1 and the host 402 via A Side Port 422-1.

In a number of embodiments, the memory devices 424-1, . . . , 424-4 can be coupled to the memory devices 421-1, . . . , 421-8 via B Side Ports. Data can be transferred between the memory devices 421-1, . . . , 421-8 and the memory devices 424-1, . . . , 424-4 via B Side Ports in response to a second number of commands via a second number of signals from the power management component 430 of the controller 414-1. Data can be transferred between the memory device 421-1 and the memory device 424-1 via B Side Port 413-1, for example.

In some examples, the memory devices 421-9, . . . , 421-16 can be coupled to the host 402 via A Side Ports. Data can be transferred between the memory devices 421-9, . . . , 421-16 and the host 402 via A Side Ports in response to a first number of commands via a first number of signals from the power management component 430 of controller 414-2. For example, data can be transferred between the memory device 421-9 and the host 402 via A Side Port 422-9.

In a number of embodiments, the memory devices 424-5, . . . , 424-8 can be coupled to the memory devices 421-9, . . . , 421-16 via B Side Ports. Data can be transferred between the memory devices 421-9, . . . , 421-16 and the memory devices 424-5, . . . , 424-8 via B Side Ports in response to a second number of commands via a second number of signals from the power management component 430 of the controller 414-2. Data can be transferred between the memory device 421-9 and the memory device 424-5 via B Side Port 422-25, for example.

The power management component 430 can convert a number of input signals into the first number of signals to be compatible with the first number of memory devices 421-1, . . . , 421-16 and/or the second number of signals to be compatible with the second number of memory devices 424-1, . . . , 424-8. In some examples, the number of input signals can be increased or decreased to create the first number of signals and/or the second number of signals.

In a number of embodiments, the first number of signals 421-1, . . . , 424-16 and the second number of signals 424-1, . . . , 424-8 can be voltages. In some examples, the first number of signals 421-1, . . . , 424-16 and the second number of signals 424-1, . . . , 424-8 can be different signals and/or different voltages.

Figure 5:
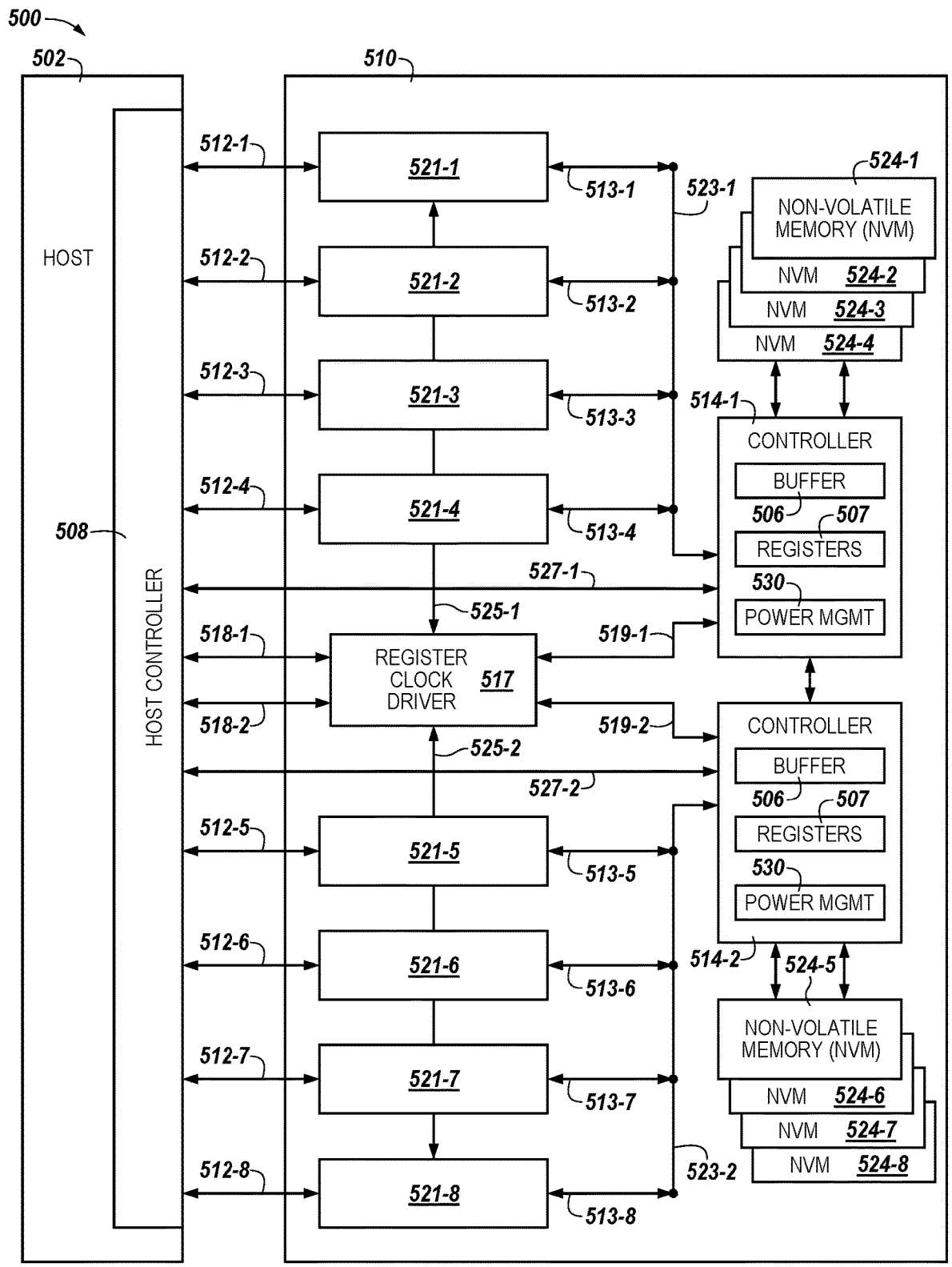
FIG. 5 is a block diagram of a computing system including a host and a memory system comprising a dual in-line memory module (DIMM) with a first and second controller and a first and second ready/busy bus in accordance with a number of embodiments of the present disclosure.

FIG. 5 is a block diagram of a computing system 500 including a host 502 and a memory system comprising a dual in-line memory module (DIMM) 510 with a first and second controller and a first and second ready/busy bus in accordance with a number of embodiments of the present disclosure. In FIG. 5, host 502 is coupled to DIMM 510 via data buses 512-1, . . . , 512-16, command/address buses 518-1 and 518-2, and ready/busy buses 527-1 and 527-2. Host 502 can be coupled to DIMM 510 via a number of channels (e.g., channels 103-1, . . . , 103-N in FIG. 1A). For example, host 502 is coupled to DIMM 510 via a first channel that includes data buses 512-1, . . . , 512-4, command/address bus 518-1, and ready/busy bus 527-1; and host 502 is coupled to DIMM 510 via a second channel that includes data buses 512-5, . . . , 512-8, command address/bus 518-2, and ready/busy bus 527-2. Controller 514-1 can receive commands from host 502 on channel 1 and controller 514-2 can receive commands from host 502 on channel 2. The commands from host 502 can be sent to register clock driver (RCD) 517 via buses 518-1 and/or 518-2 and the commands can be sent from RCD 517 to controller 514-1 via bus 519-1 and controller 514-2 via bus 519-2.

DIMM 510 can include controller 514-1 and 514-2. Controller 514-1 can be coupled to and send signals to control operation of memory devices 521-1, . . . , 521-4 and memory devices 424-1, . . . , 424-4. Controller 514-2 can be coupled to and send signals to control operation of memory devices 521-5, . . . , 521-8 and memory devices 524-5, . . . , 524-8. DIMM 510 with controllers 514-1 and 514-2 can allow memory devices 521-1, . . . , 521-4 and memory devices 524-1, . . . , 524-4 to operation independently from memory devices 521-5, . . . , 521-8 and memory devices 524-5, . . . , 524-8. Controller 514-1 is coupled to controller 514-2 and data can be transferred between controller 514-1 and 514-2. Therefore controller 514-1 can operate memory devices 521-1, . . . , 521-4 and memory devices 524-1, . . . , 524-4 independently from other memory device and also transfer data from memory devices 521-1, . . . , 521-4 and memory devices 524-1, . . . , 524-4 to other memory devices, such as memory devices 521-5, . . . , 451-8 and memory devices 524-5, . . . , 524-8.

DIMM 510 can include a first number of memory devices 521-1, . . . , 521-8. For example, memory devices 521-1, . . . , 521-8 can be DRAM memory devices, among other types of volatile and/or non-volatile memory. DIMM 510 can include a second number of memory devices 524-1, . . . , 524-8. For example, memory devices 521-1, . . . , 521-8 can be 3D XPoint memory devices, among other types of volatile and/or non-volatile memory.

Controllers 514-1 and 514-2 can send a ready/busy signal to host 502 on the ready/busy buses 527-1 and 524-2, respectively. The ready/busy signal can indicate to host 502 whether or not the controller 514-1 and/or 514-2 is ready to receive commands from host 502. For example, if controller 514-1 on DIMM 510 is busy executing commands, such as transferring data between memory devices 521-1, . . . , 521-4 and memory devices 524-1, . . . , 524-4, the controller 514-1 is not ready to receive commands on channel 1, but controller 514-2 could receive commands on channel 2. A ready/busy signal can be sent by controller 514-1 on ready/busy bus 527-1 to host 502 that indicates controller 514-1 is not ready to receive commands on channel 1 and a ready/busy signal can be sent by controller 514-2 on ready/busy bus 527-2 to host indicating controller 514-2 is ready to receive command from host 502 on channel 2. Host 502 can send commands on the second channel to controller 514-2 for execution on memory device 521-5, . . . , 521-8 and/or memory devices 524-5, . . . , 524-8. Once controller 514-1 is no longer busy executing commands, such as commands that transfer data on memory device associated with channel 1, controller 514-1 can send a ready/busy signal on ready/busy bus 527-1 to host 502 indicating controller 514-1 is ready to receive commands from host 502 on channel 1. Host 502 can send commands to controller 514-1 on channel 1 in response to receiving the ready/busy signal.

Controllers 514-1 and 514-2 can receive commands from host 502. The commands from host 502 can be sent to register clock driver (RCD) 517 via buses 518-1 and/or 518-2 and the commands can be sent from RCD 517 to controllers 514-1 and 514-2 via buses 519-1 and/or 519-2, respectively. Controllers 514-1 and 514-2 can receive the commands from RCD 517 and store data associated with the commands (e.g., command instructions and/or data read from and/or to be written to memory devices 521 and/or 524 during execution of the commands) in buffer 506. Controllers 514-1 and 514-2 can send the commands to memory devices 521-1, . . . , 521-8 on bus 525-1 and/or 525-2 via RCD 517 and memory devices 521-1, . . . , 521-8 can execute the commands by transferring data between memory devices 521-1, . . . , 521-8 and host 502 and/or memory devices 521-1, . . . , 521-8 and memory device 524-1, . . . , 524-8. Memory devices 521-1, . . . , 521-8 can send signals on buses 525-1 and 525-2 to RCD 517 and controllers 514-1 and 514-2 that indicate memory devices 521-1, . . . , 521-8 have completed execution of commands and are ready for additional commands. Once a command has been executed, controllers 514-1 and 514-2 can send a status signal to the host 502 indicating that the command received from host 502 has been executed. Controllers 514-1 and 514-2 can include non-volatile and/or volatile memory, such as SRAM memory, that can be a buffer 506, a register 507 used during execution of commands, and/or a power management component 530.

Memory system 500 can be configured to execute commands sent from host 502 to DIMM 510 by sending command/address information from the host controller 508 on command/address bus 518 to the register clock driver (RCD) 517 and data on data buses 512-1, . . . , 512-8. The commands from the host can include address information for memory devices 521-1, . . . 521-8 where the host is requesting an operation on data at particular location in memory devices 521-1, . . . 521-16. The commands from the host can include address information for memory devices 524-1, . . . , 524-4 where the host is requesting an operation on data at particular location in memory devices 524-1, . . . , 524-4, while memory devices 521-5, . . . 521-8 can act as a buffer during execution of the commands.

In a number of embodiments, memory devices 521-1, . . . 521-8 can be configured as cache. For example, memory devices can be configured as cache for the data stored in memory devices 524-1, . . . , 524-8 and/or other memory devices coupled to the computing system. The DIMM 510 can be configured to have a portion of memory devices 521-1, . . . 521-8 addressable by host 502 and a portion of the memory devices 521-1, . . . 521-8 configured as cache.

In a number of embodiments, commands can be received from host 502 and/or generated by controllers 514-1 and 514-2 to transfer data between memory devices 524-1, . . . , 524-8. Data can be transferred between memory devices 524-1, . . . , 524-8 via controllers 514-1 and 514-2 using buffers 506 and/or registers 507.

Figure 6:
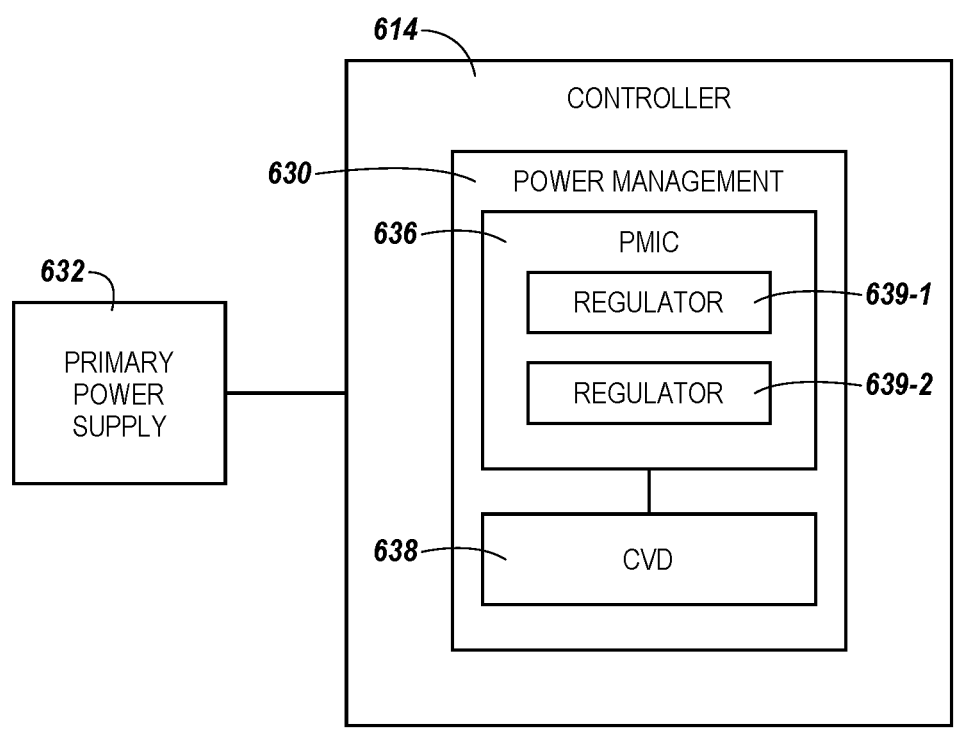
FIG. 6 is a block diagram of a computing system including a primary power supply and a controller in accordance with a number of embodiments of the present disclosure.

FIG. 6 is a block diagram of a computing system including a primary power supply and a controller in accordance with a number of embodiments of the present disclosure.

In a number of embodiments, the primary supply signal can be, but is not limited to being generated by an electrical outlet, a battery, an AC/DC converter, or a combination thereof. The primary power supply 632 can send the primary supply signal to the power management component 630 and the primary supply signal can be received by the power management component 630. In some examples, the primary supply signal can be a voltage.

The controller 614 of the system 631 can include the power management component 630 and a capacitive voltage divider (CVD) 638. The power management component 630 can receive an input signal (e.g., primary supply signal) from the primary power supply 632 and allocate and/or modify the input signal to be compatible with the operation of one or more memory devices based on power management criteria for the memory devices.

In a number of embodiments, the power management component 630 can convert a number of input signals into an output signal, which can be a voltage, that can be based on an operation state. The operation state can be an active state or a reduced power state. In some examples, the reduced power state can be a sleep state, a standby state, or an off state. The power management component 630 can be configured to output a lower voltage signal in the reduced power state or a higher voltage signal in an active state, for example.

The power management component 630 can include a power management integrated circuit (PMIC) 636. The PMIC 636 can include one or more regulators 639-1, 639-2. The one or more regulators 639-1, 639-2 can convert a number of input signals into a number of output signals, which can be a first number of signals and/or a second number of signals. In some examples, the number of input signals can be increased and/or decreased to create the first number of signals and/or the second number of signals. The one or more regulators 639-1, 639-2 can include a low-dropout (LDO) regulator, a buck-boost converter, a buck regulator, or a combination thereof.

In a number of embodiments, the CVD 638 can be coupled to the PMIC 636. The CVD 638, for example, can receive a primary supply signal from the primary power supply 632. The CVD 638 can convert the primary supply signal to a modified primary supply signal to make it compatible with the operation of the PMIC 636.

Figure 7:
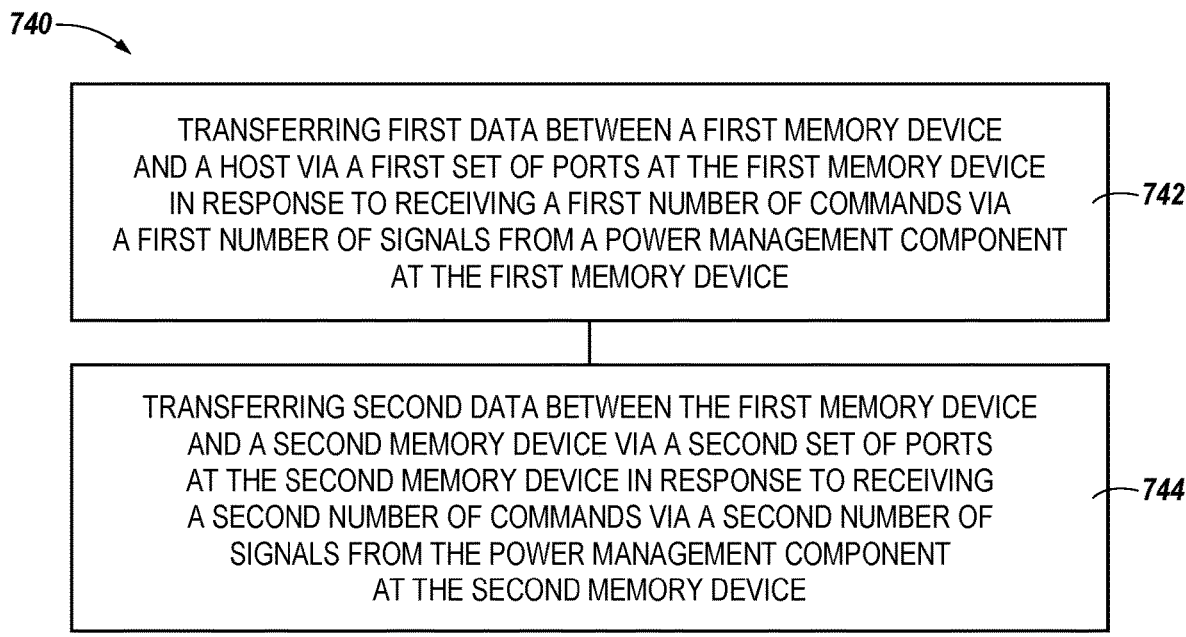
FIG. 7 is a flow diagram illustrating an example data transfer in memory process using a port in accordance with a number of embodiments of the present disclosure.

FIG. 7 is a flow diagram illustrating an example data transfer in memory process using a port in accordance with a number of embodiments of the present disclosure.

At block 742, the method 740 can include transferring first data between a first memory device and a host via a first set of ports at the first memory device in response to receiving a first number of commands via a first number of signals from a power management component at the first memory device.

At block 744, the method 740 can further include transferring second data between the first memory device and a second memory device via a second set of ports at the second memory device in response to receiving a second number of commands via a second number of signals from the power management component at the second memory device.

Figure 8:
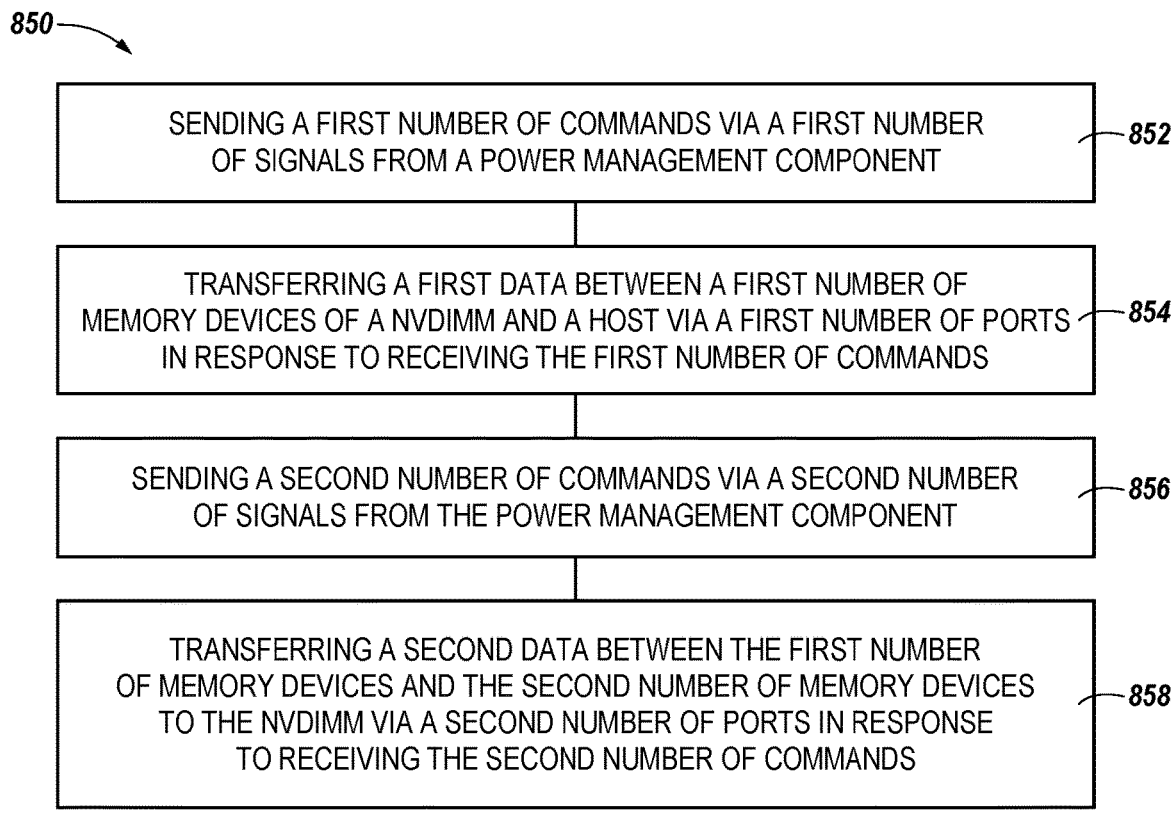
FIG. 8 is a flow diagram illustrating an example data transfer in memory process using a port in accordance with a number of embodiments of the present disclosure.

FIG. 8 is a flow diagram illustrating an example data transfer in memory process using a port in accordance with a number of embodiments of the present disclosure.

At block 852, the method 850 can include sending a first number of commands via a first number of signals from a power management component.

At block 854, the method 850 can include transferring a first data between a first number of memory devices of a non-volatile dual in-line memory module (NVDIMM) and a host via a first number of ports in response to receiving the first number of commands.

At block 856, the method 850 can further include sending a second number of commands via a second number of signals from the power management component.

At block 858, the method 850 can further include transferring a second data between the first number of memory devices and the second number of memory devices of the non-volatile dual in-line memory module (NVDIMM) via a second number of ports in response to receiving the second number of commands.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). For the avoidance of doubt, a list of at least one of A, B, or C, or any combination thereof is likewise an inclusive list. Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a first number of memory devices coupled to a host via a first number of ports of the first number of memory devices, wherein a first number of commands are executed via a first number of signals from a power management component to transfer first data between the first number of memory devices and the host via the first number of ports, wherein the power management component converts a number of input signals into the first number of signals based on power management criteria for the first number of memory devices; and
a second number of memory devices coupled to the first number of memory devices via a second number of ports, wherein a second number of commands via a second number of signals from the power management component are executed to transfer second data between the first number of memory devices and the second number of memory devices via the second number of ports while the first number of commands are executed to transfer the first data between the first number of memory devices and the host, wherein the power management component converts the number of input signals into the second number of signals based on power management criteria for the second number of memory devices to increase efficiency of the apparatus by decreasing a magnitude of the second number of signals.

2. The apparatus of claim 1, wherein the power management component converts the number of input signals into the first number of signals to be compatible with the first number of memory devices.

3. The apparatus of claim 1, wherein the power management component converts the number of input signals into the second number of signals to be compatible with the second number of memory devices.

4. The apparatus of claim 1, wherein the first number of signals and the second number of signals are different.

5. The apparatus of claim 1, wherein the first number of signals and the second number of signals are voltages.

6. The apparatus of claim 1, wherein the power management component converts a number of input signals into the first number of signals and the second number of signals based on an operation state of the apparatus.

7. The apparatus of claim 6, wherein the operation state is an active state or a reduced power state.

8. The apparatus of claim 7, wherein the reduced power state is one of a sleep state, a standby state, or an off state.

9. An apparatus, comprising:
a non-volatile dual in-line memory module (NVDIMM), wherein the NVDIMM includes a first number of memory devices and a second number of memory devices coupled to a controller, wherein the NVDIMM is couplable to a host, and wherein the NVDIMM is configured to:
perform operations on the first number of memory devices with a first set of signals from a power control manager, wherein the power control manager converts a number of input signals into the first set of signals based on power management criteria for the first number of memory devices; and
perform operations on the second number of memory devices with a second set of signals from the power control manager while performing operations on the first number of memory devices with the first set of signals, wherein the power control manager converts the number of input signals into the second set of signals based on power management criteria for the second number of memory devices to increase efficiency of the apparatus by decreasing a magnitude of the second set of signals.

10. The apparatus of claim 9, wherein the NVDIMM is configured to perform operations on the first number of memory device with a third set of signal from the power control manager.

11. The apparatus of claim 9, wherein the power management component includes a power management integrated circuit (PMIC).

12. The apparatus of claim 11, wherein the PMIC can include one or more regulators.

13. The apparatus of claim 12, wherein the one or more regulators are configured to convert the number of input signals into the first number of signals and the second number of signals.

14. The apparatus of claim 12, wherein the one or more regulators include a low-dropout (LDO) regulator, a buck-boost converter, a buck regulator, or a combination thereof.

15. A method, comprising:
transferring first data between a first memory device of an apparatus and a host via a first set of ports at the first memory device in response to receiving a first number of commands via a first number of signals from a power management component at the first memory device, wherein the power management component converts a number of input signals into the first number of signals based on power management criteria for the first memory device; and
transferring second data between the first memory device and a second memory device of the apparatus via a second set of ports at the second memory device in response to receiving a second number of commands via a second number of signals from the power management component at the second memory device while transferring the first data between the first memory device and the host, wherein the power management component converts the number of input signals into the second number of signals based on power management criteria for the second memory device to increase efficiency of the apparatus by decreasing a magnitude of the second number of signals.

16. The method of claim 15, further including increasing the number of input signals to create the first number of signals.

17. The method of claim 15, further including decreasing the number of input signals to create the first number of signals.

18. The method of claim 15, further including sending a modified primary supply signal from the CVD to a power management integrated circuit (PMIC).

19. The method of claim 18, further including receiving a primary supply signal at the CVD and converting the primary supply signal to the modified primary supply signal.

20. The method of claim 18, wherein the modified primary supply signal is compatible with operation of the PMIC.

21. A method, comprising:
sending a first number of commands via a first number of signals from a power management component to a first number of memory devices of a non-volatile dual in-line memory module (NVDIMM), wherein the power management component converts a number of input signals into the first number of signals based on power management criteria for the first number of memory devices;
transferring a first data between the first number of memory devices and a host via a first number of ports in response to receiving the first number of commands;
sending a second number of commands via a second number of signals from the power management component to a second number of memory device of the NVDIMM, wherein the power management component converts the number of input signals into the second number of signals based on power management criteria for the second number of memory devices to increase efficiency of the NVDIMM by decreasing a magnitude of the second number of signals; and
transferring a second data between the first number of memory devices and the second number of memory devices via a second number of ports in response to receiving the second number of commands.

22. The method of claim 21, further comprising the power management component receiving the number of input signals.

23. The method of claim 22, further comprising sending the number of input signals from a primary power supply.

24. The method of claim 22, further comprising generating the number of input signals from an electrical outlet, a battery, an AC/DC converter, or a combination thereof.

\* \* \* \* \*